(12) United States Patent
Mitsuhashi et al.

(10) Patent No.: US 7,994,036 B2
(45) Date of Patent: Aug. 9, 2011

(54) SEMICONDUCTOR DEVICE AND FABRICATION METHOD FOR THE SAME

(75) Inventors: Riichirou Mitsuhashi, Toyama (JP); Takayuki Yamada, Toyama (JP)

(73) Assignee: Panasonic Corporation, Osaka (JP)

( * ) Notice: Subject to any disclaimer, the term of this patent is extended or adjusted under 35 U.S.C. 154(b) by 147 days.

(21) Appl. No.: 12/492,605

(22) Filed: Jun. 26, 2009

(65) Prior Publication Data

US 2010/0001348 A1  Jan. 7, 2010

(30) Foreign Application Priority Data

Jul. 1, 2008 (JP) ................................. 2008-172572
Nov. 4, 2008 (JP) ................................. 2008-283607

(51) Int. Cl.
*H01L 21/3205* (2006.01)
*H01L 21/4763* (2006.01)
(52) U.S. Cl. .................... 438/585; 438/587; 257/E27.06
(58) Field of Classification Search .................. 438/197, 438/585, 587, 588
See application file for complete search history.

(56) References Cited

U.S. PATENT DOCUMENTS

| | | | | |
|---|---|---|---|---|
| 3,909,306 | A * | 9/1975 | Sakamoto et al. | 438/286 |
| 6,784,508 | B2 * | 8/2004 | Tsunashima et al. | 257/411 |
| 7,109,079 | B2 | 9/2006 | Schaeffer, III et al. | |
| 2007/0007602 | A1 | 1/2007 | Oda et al. | |
| 2008/0096383 | A1 | 4/2008 | Tigelaar et al. | |
| 2008/0203488 | A1 | 8/2008 | Chung et al. | |

OTHER PUBLICATIONS

T. Hayashi et al., "Cast Worthy and High Performance LSTP CMIS; Poly-Si/HfSiON nMIS and Poly-Si/TiN/HfSiON pMIS," IEDM, 2006, pp. 247.
F. Ootsuka et al., "Full-Metal-Gate Integration of Dual-Metal-Gate HfSiON CMOS Transistors by Using Oxidation-Free Dummy-Mask Process," Extended Abstracts of the 2006 International Conference on Solid State Devices and Materials, 2006, pp. 1116-1117.
N. Mise et al., "Single Metal/Dual High-k Gate Stack with Low Vth and Precise Gate Profile Control for Highly Manufacturable Aggressively Scaled CMISFETs," IEDM 2007, pp. 527-530.

* cited by examiner

*Primary Examiner* — Chuong A Luu
*Assistant Examiner* — Nga Doan
(74) *Attorney, Agent, or Firm* — McDermott Will & Emery LLP

(57) ABSTRACT

The semiconductor device includes a first transistor and a second transistor formed in a semiconductor substrate. The first transistor includes: a first gate insulating film formed on the semiconductor substrate; and a first gate electrode formed on the first gate insulating film. The second transistor includes: a second gate insulating film formed on the semiconductor substrate; and a second gate electrode formed on the second gate insulating film. The first gate insulating film includes a first insulating material with a first element diffused therein, the second gate insulating film includes the first insulating material, and the amount of the first element contained in the first gate insulating film is greater than the amount of the first element contained in the second gate insulating film.

13 Claims, 13 Drawing Sheets

SEMICONDUCTOR DEVICE AND FABRICATION METHOD FOR THE SAME

CROSS-REFERENCE TO RELATED APPLICATIONS

This application claims priority under 35 U.S.C. §119 on Patent Application No. 2008-283607 filed in Japan on Nov. 4, 2008 and Patent Application No. 2008-172572 filed in Japan on Jul. 1, 2008, the entire contents of which are hereby incorporated by reference.

BACKGROUND OF THE INVENTION

The present invention relates to a semiconductor device and a fabrication method for the same, and more particularly, to a semiconductor device having two types of especially miniaturized transistors and a fabrication method for the same.

In recent years, there have been requests for semiconductor devices with lower power and higher-speed operation. For speedup of semiconductor devices, known is a method in which the gate capacitance of a metal insulator semiconductor field effect transistor (MISFET) is increased to increase the drive current.

To increase the gate capacitance, a gate insulating film must be thinned to shorten the inter-electrode distance (distance between a substrate and a gate electrode). At present, the physical thickness of the gate insulating film of a MISFET has been reduced to as small as about 2 nm when silicon oxide nitride (SiON) is used.

With the thinning of the gate insulating film, increase in gate leak has increasingly become a problem to be addressed. To reduce the gate leak, use of a material high in dielectric constant such as hafnium (Hf) oxide, in place of a conventionally used silicon oxide ($SiO_2$) series material, as the gate insulating film has been examined.

The thinning of the gate insulating film also causes a problem that with the hitherto used gate electrode made of polysilicon, the gate capacitance decreases due to depletion of the gate electrode. The decrease of the gate capacitance is equivalent to increase by about 0.5 nm of the thickness of the gate oxide film made of $SiO_2$, for example. The thinning of the gate insulating film inevitably involves increase in gate leak. However, if only the depletion can be suppressed, the effective thickness of the gate insulating film can be reduced with no increase in gate leak. In the case of $SiO_2$, when the thickness is reduced by 0.1 nm, the leak current will be ten or more times as large as that before the thinning. In this case, therefore, the effect of suppressing the depletion of the gate electrode will be great.

To avoid depletion of the gate electrode, examination has been made on replacing the material of the gate electrode from polysilicon to a metal free from causing depletion. However, while it is possible to form electrodes for p-MISFETs and electrodes for n-MISFETs differentially with polysilicon by forming an impurity level with implantation of an impurity, such differential formation is not available with metal.

In the present semiconductor devices, reduction in threshold voltage (Vt) is indispensable to respond to the request for higher-speed operation. For lower Vt, electrodes for p-MISFETs and electrodes for n-MISFETs must have work function (WF) values close to the band edges of silicon. While a high WF close to the WF value (about 5.2 eV) at the top (top edge) of the valence band of silicon is required for electrodes for p-MISFETs, a low WF close to the WF value (about 4.1 eV) at the bottom (bottom edge) of the conduction band of silicon is required for electrodes for n-MISFETs.

Since there is no ideal metal material responding to the above request, examination has been made on use of a metal having a WF value corresponding to roughly the center between the WF value of the p-side region and the WF value of the n-side region. With this, a p-MISFET and an n-MISFET can be made to have the same Vt value. However, as the request for lower Vt progresses, such a semiconductor device is becoming no more practical.

At present, searches have been vigorously made for metal materials usable as electrodes for p-MISFETs and n-MISFETs, and recently some promising candidates have been found. Promising candidates for n-MISFET electrodes include Ta series electrodes such as TaC and TaN in combination with a gate insulating film (including the case of a cap of a gate insulating film) including a lanthanoid series material such as La. Promising candidates for p-MISFET electrodes include precious metals such as Pt and Ir, MoO, and the like.

In actual application of the above metal materials to transistors, use of a metal inserted poly-Si (MIPS) structure has been examined from the standpoints of consistency with the conventional processes and microfabrication. The MIPS structure is a multilayer structure of a metal material having a thickness of about 10 nm or less and polysilicon having a thickness of about 100 nm or less deposited on the metal material.

A complicate process must be passed for fabricating a semiconductor device like a complementary metal insulator semiconductor (CMIS) having a p-MISFET and an n-MISFET whose gate electrodes are different in material or composition formed on the same semiconductor substrate. For example, a metal for the n-MISFET is deposited on a gate insulating film, the portion of the metal for the n-MISFET formed in the p-MISFET region is selectively removed, and a metal for the p-MISFET is deposited on the portion of the gate insulating film in the p-MISFET region (see F. Ootsuka, et al., "extended abstract of the 2006 international conference on solid state device and materials, Yokohama," 2006, pp. 1116-1117 (Non-Patent Document 1), for example).

The above process not only increases the number of process steps, but also causes a non-negligible increase in misalignment because two times of lithography are necessary for removal of the portion of the p-MISFET metal deposited in the n-MISFET region and for removal of the portion of the n-MISFET metal deposited in the p-MISFET region.

If the metal for the p-MISFET and the metal for the n-MISFET overlap each other at the boundary between the p-MISFET region and the n-MISFET region, a metal remainder will be formed at gate etching. For this reason, it is not allowed to form the metal for the p-MISFET and the metal for the n-MISFET continuously. At present, the required minimum width of the element isolation region (STI) is 100 nm or less. If the minimum width of the element isolation region becomes smaller, it will be substantially difficult to secure an alignment margin with which the metal for the p-MISFET and the metal for the n-MISFET will never be in contact with each other and the interface of the metals will never be shifted to enter an element formation region from the element isolation region. Also, etching of the element isolation region that may occur during each etching process step will cause a serious problem.

For simplifying the process, an attempt has been made to form the gate electrode of a p-MISFET and the gate electrode of an n-MISFET of a same metal material. In this method, in either the p-MISFET or the n-MISFET, a cap film having a thickness of about 1 nm may be inserted between the gate insulating film and the gate electrode, to obtain optimum effective work functions (eWF) required for the p-MISFET and the n-MISFET. Examination has also been made to use different cap films for the p-MISFET and the n-MISFET (see N. Mise et al., IEDM 2007, pp. 527-530 (Non-Patent Document 2), for example). In this structure, in which the gate electrode of the p-MISFET and the gate electrode of the n-MISFET are made of a same material, working such as gate etching is greatly simplified.

SUMMARY OF THE INVENTION

However, the conventional semiconductor device having a cap film has a problem as follows. It is very difficult to form a cap film in only one of the p-MISFET and the n-MISFET or form different cap films in the p-MISFET and the n-MISFET.

For example, in the case of forming a cap film in only the n-MISFET, after formation of a cap film having a thickness of about 1 nm over the entire surface, the portion of the cap film in the p-MISFET region must be removed. Selective removal of a thin cap film with high precision is very difficult. Since the influence of the thickness of the cap film on eWF is very large, eWF will greatly vary if the cap film is made thinner or remains unremoved. Resultantly, the threshold voltage will greatly change. Also, there is a problem that the cap film and the gate insulating film may be damaged in the above process steps.

In the case of adopting a process in which after formation of a gate stack for the p-MISFET, for example, a gate stack for the n-MISFET is formed starting from the gate insulating film (see Non-Patent Document 2, for example), roughly the same number of steps as in the case of using different materials for the gate electrode of the p-MISFET and the gate electrode of the n-MISFET will be necessary (see Non-Patent Document 1, for example).

To solve the above problem, an object of the present disclosure is to implement a semiconductor device in which the effect of a cap film is given to only a transistor of one conductivity type without increasing the number of process steps.

To attain the above object, an example semiconductor device includes a first transistor having a gate insulating film with a cap material diffused therein and a second transistor having a gate insulating film little containing the cap material.

Specifically, the example semiconductor device includes a first transistor and a second transistor formed in a semiconductor substrate. The first transistor includes: a first gate insulating film formed on the semiconductor substrate; and a first gate electrode formed on the first gate insulating film. The second transistor includes: a second gate insulating film formed on the semiconductor substrate; and a second gate electrode formed on the second gate insulating film. The first gate insulating film includes a first insulating material with a first element diffused therein, the second gate insulating film includes the first insulating material, and the amount of the first element contained in the first gate insulating film is greater than the amount of the first element contained in the second gate insulating film.

In the example semiconductor device, the first gate insulating film includes the first insulating material with the first element diffused therein, and the amount of the first element contained in the first gate insulating film is greater than the amount of the first element contained in the second gate insulating film. Hence, when the first element has the effect of reducing eWF, for example, the eWF of the first transistor decreases, but the eWF of the second transistor does not vary. In reverse, when the first element has the effect of increasing eWF, the eWF of the first transistor increases, but the eWF of the second transistor does not vary. Also, since the first gate insulating film and the second gate insulating film are the same in basic configuration except for the amount of the first element, they can be formed without the necessity of selective etching of a thin cap film.

The first fabrication method for a semiconductor device of the present disclosure includes the steps of: (a) forming an insulating film and a first electrode film sequentially in this order on the entire surface of a semiconductor substrate having a first region and a second region; (b) removing a portion of the first electrode film formed on the first region; (c) forming a first cap film containing a first element over the semiconductor substrate and thereafter subjecting the resultant substrate to heat treatment after the step (b), to allow the first element to diffuse into a portion of the insulating film formed on the first region and at least a top portion of the first electrode film; (d) removing the first cap film after the step (c); (e) forming a second electrode film over the semiconductor substrate after the step (d); and (f) etching at least the second electrode film and the insulating film, to form a first gate insulating film including the insulating film with the first element diffused therein and a first gate electrode including the second electrode film on the first region, and form a second gate insulating film including the insulating film and a second gate electrode including the second electrode film on the second region.

In the first fabrication method for a semiconductor device, the first cap film is formed with the first electrode film remaining only on the second region, to allow the first element to diffuse under heating. Hence, while the first element diffuses into the portion of the insulating film, which is to be the gate insulating film, formed on the first region, the first element little diffuses into the portion thereof formed on the second region. In this way, the first element that changes the value of eWF can be introduced into only the first gate insulating film of the first transistor without the necessity of selective working of the first cap film.

The second fabrication method for a semiconductor device of the present disclosure includes the steps of: (a) forming an insulating film, a first electrode film, and a hard mask sequentially in this order on the entire surface of a semiconductor substrate having a first region and a second region; (b) removing a portion of the hard mask formed on the first region; (c) forming a first cap film containing a first element over the semiconductor substrate and thereafter subjecting the resultant substrate to heat treatment after the step (b), to allow the first element to diffuse into a portion of the insulating film formed on the first region and at least a top portion of the hard mask; (d) removing the first cap film and the hard mask after the step (c); (e) forming a second electrode film over the semiconductor substrate after the step (d); and (f) etching at least the second electrode film, the first electrode film, and the insulating film, to form a first gate insulating film including the insulating film with the first element diffused therein and a first gate electrode including the second electrode film on the first region, and form a second gate insulating film including the insulating film and a second gate electrode including the second electrode film and the first electrode film on the second region.

In the second fabrication method for a semiconductor device, the first cap film is formed with the hard mask remaining only on the second region, to allow the first element to diffuse under heating. Hence, while the first element diffuses into the portion of the insulating film, which is to be the gate insulating film, formed on the first region, the first element little diffuses into the portion thereof formed on the second region. In this way, the first element that changes the value of eWF can be introduced into only the first gate insulating film of the first transistor without the necessity of selective working of the first cap film. Also, since there is no possibility of diffusion of the first element into the first electrode film, removal of the first electrode film is unnecessary. Hence, the electrode film of the second gate electrode can be made thicker than that of the first gate electrode.

DESCRIPTION OF THE PREFERRED EMBODIMENTS

Embodiment 1

Figure 1:
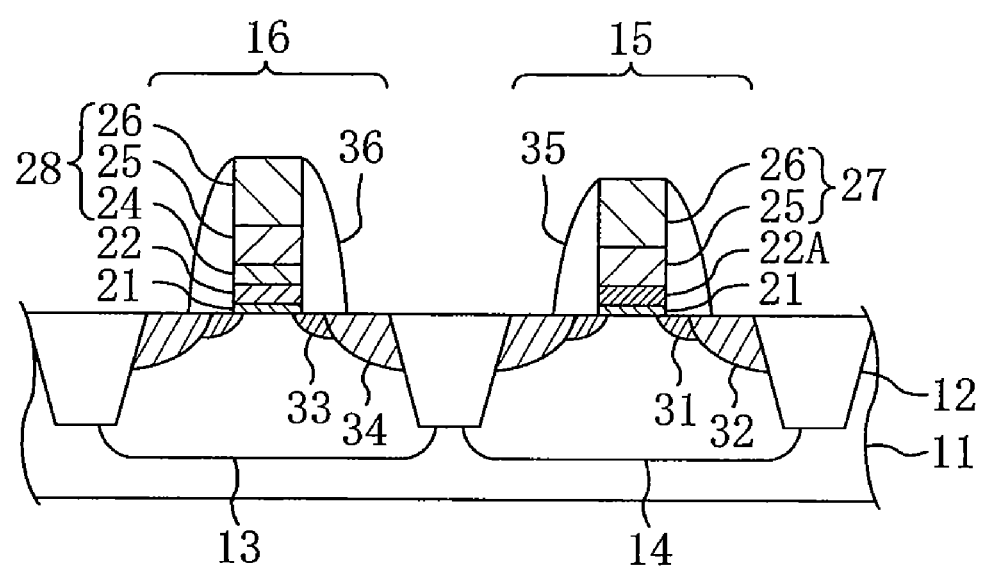
FIG. 1 is a cross-sectional view of a semiconductor device of Embodiment 1.

Embodiment 1 of the present invention will be described with reference to the accompanying drawings. FIG. 1 shows a cross-sectional configuration of a semiconductor device of Embodiment 1. As shown in FIG. 1, the semiconductor device of this embodiment includes a first transistor 15 and a second transistor 16 both formed on a semiconductor substrate 11 such as a silicon substrate, for example. In this embodiment, description will be made assuming that the first transistor 15 is an n-MISFET and the second transistor 16 is a p-MISFET.

The first transistor 15 is formed in a p-type active region 14 of the semiconductor substrate 11, and the second transistor 16 is formed in an n-type active region 13 thereof. The p-type active region 14 and the n-type active region 13 are isolated from each other with an element isolation region 12.

The first transistor 15 includes a first gate insulating film formed on an underlying film 21 made of silicon oxide ($SiO_2$). The first gate insulating film is a cap material-diffused film 22A made of a nitrogen-added hafnium silicate film (HfSiON) with lanthanum oxide (LaO) diffused therein. A first gate electrode 27 is formed on the first gate insulating film. The first gate electrode 27 is a multilayer film including a second electrode film 25 made of titanium nitride (TiN) and a third electrode film 26 made of polysilicon. First sidewalls 35 are formed on the side faces of the first gate electrode 27. First extension regions 31 are formed on the sides of the first gate electrode 27 in the semiconductor substrate 11, and first source/drain regions 32 are formed on the outer sides of the first extension regions 31.

The second transistor 16 includes a second gate insulating film formed on the underlying film 21 made of $SiO_2$. The second gate insulating film is an insulating film 22 made of HfSiON. A second gate electrode 28 is formed on the second gate insulating film. The second gate electrode 28 is a multilayer film including a first electrode film 24 made of TiN, the second electrode film 25, and the third electrode film 26. Second sidewalls 36 are formed on the side faces of the second gate electrode 28. Second extension regions 33 are formed on the sides of the second gate electrode 28 in the semiconductor substrate 11, and second source/drain regions 34 are formed on the outer sides of the second extension regions 33.

In the semiconductor device of this embodiment, both the first and second gate insulating films include HfSiOH as the first insulating material. While the first gate insulating film has La as the first element diffused in HfSiON, the second gate insulating film is basically made of HfSiON containing no La. Also, while the first gate electrode 27 has the second electrode film 25 as the TiN film, the second gate electrode 28 has the multilayer film of the first electrode film 24 and the second electrode film 25 as the TiN film. In other words, the second gate electrode 28 has a TiN film thicker than the first gate electrode 27.

As will be described later, the eWF of a gate electrode made of a TiN film decreases under the influence of an La-diffused HfSiON film. Also, the value of eWF is greater as the TiN film is thicker. Accordingly, the semiconductor device of this embodiment includes the n-MISFET small in eWF and the p-MISFET large in eWF. Also, the first gate insulating film and the second gate insulating film are the same in configuration except that La is diffused in the first gate insulating film, and hence can be formed without the necessity of selective etching of a thin cap film.

Figure 2A:
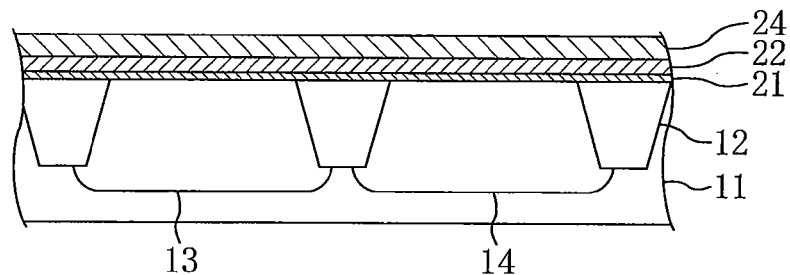
FIGS. 2A through 2D are cross-sectional views illustrating, in order of steps, a fabrication method for the semiconductor device of Embodiment 1.

Hereinafter, a fabrication method for the semiconductor device of Embodiment 1 will be described with reference to the relevant drawings. First, as shown in FIG. 2A, the n-type active region 13 and the p-type active region 14 isolated from each other with the element isolation region 12 are formed in the semiconductor substrate 11 made of silicon. Subsequently, the underlying film 21 made of $SiO_2$ having a thickness of 1 nm, the insulating film 22 made of HfSiON having a thickness of 2.5 nm, and the first electrode film 24 made of TiN having a thickness of 5 nm are sequentially formed on the semiconductor substrate 11.

The underlying film 21 may be formed by rapid thermal oxidation (RTO) using oxygen gas. In place of RTO, heat treatment using a heat oven may be adopted, and a gas species other than the oxygen gas may be used. Also, in place of the thermal oxide film, a chemical oxide film and the like, or even a silicon oxide nitride (SiON) film, may be used.

The insulating film 22 may be formed by depositing a hafnium silicate (HfSiO) film by metal organic chemical vapor deposition (MOCVD), atomic layer deposition (ALD), or the like and then subjecting the HfSiO film to plasma nitriding to form an HfSiON film. In place of the HfSiON film, any other high dielectric constant film such as an aluminum oxide ($Al_2O_3$) film, a zirconium oxide ($ZrO_2$) film, a hafnium oxide ($HfO_2$) film, a scandium oxide (ScO) film, or the like may be used. Otherwise, depending on the material of a first cap film to be described later, a lanthanoid series insulating film such as an LaO film, a dysprosium oxide (DyO) film, or the like may be used. When LaO, DyO, or the like is used as the insulating film, a material, such as MgO, ScO, or the like, that has an eWF reducing effect and diffuses in the insulating film, and yet a redundancy of which failing to diffuse can be removed selectively may be selected as the first cap film.

Otherwise, an $SiO_2$ film, an SiON film, or the like, which is not a high dielectric, may be used depending on the use. Also, in place of MOCVD, chemical vapor deposition (CVD), physical vapor deposition (PVD), and the like may be adopted.

Figure 2B:
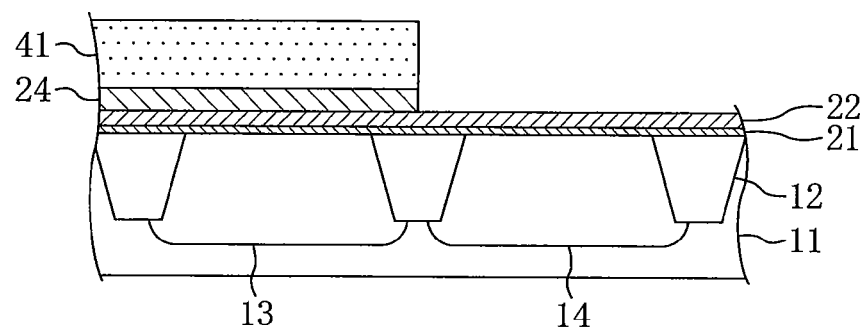

As shown in FIG. 2B, a resist film 41 is formed covering the n-type active region 13. Thereafter, using the resist film 41 as the mask, the portion of the first electrode film 24 formed on the p-type active region 14 is removed.

Figure 2C:
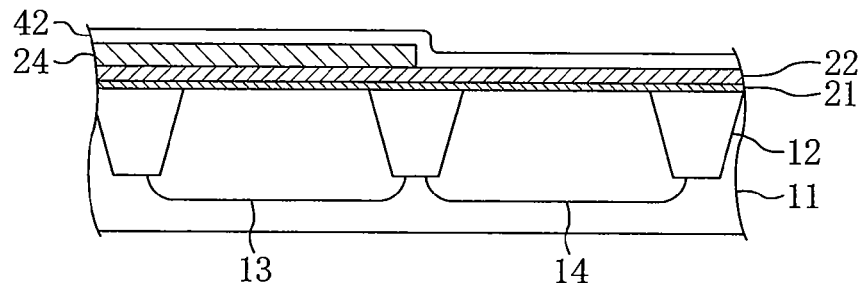

As shown in FIG. 2C, after removal of the resist film 41 by cleaning with a thinner, a first cap film 42 made of LaO having a thickness of 1 nm is formed on the resultant semiconductor substrate 11.

Figure 2D:
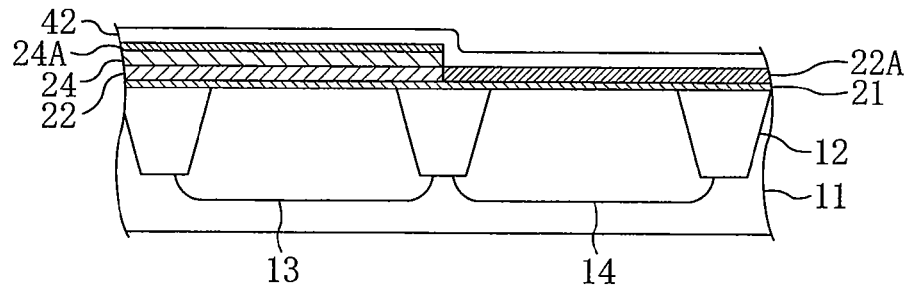

As shown in FIG. 2D, heat treatment is performed at 800° C. for 10 minutes, whereby LaO thermally diffuses, changing the portion of the insulating film 22 formed on the p-type active region 14 to a cap material-diffused film 22A containing LaO. Also, a cap material-diffused region 24A in which LaO diffuses is formed in the top portion of the first electrode film 24. In the case where the first electrode film 24 is made of TiN and the first cap film 42 is made LaO, the cap material-diffused region 24A is a TiN film in which LaO thermally diffuses (a titanium lanthanum nitride film).

The first cap film 42, which may just be an insulating film having the effect of reducing the eWF of an electrode, may be made of an oxide of a lanthanoid series element such as DyO, in place of LaO, or made of ScO, magnesium oxide (MgO), or the like. The thickness of the first cap film 42 may be changed depending on the value of eWF required. Specifically, the first cap film 42 may be made thick for further reducing eWF, and may be made thin for setting eWF at a higher value. The temperature and time of the heat treatment may be changed appropriately depending on the thickness of the insulating film 22 and the value of eWF required.

Figure 3A:
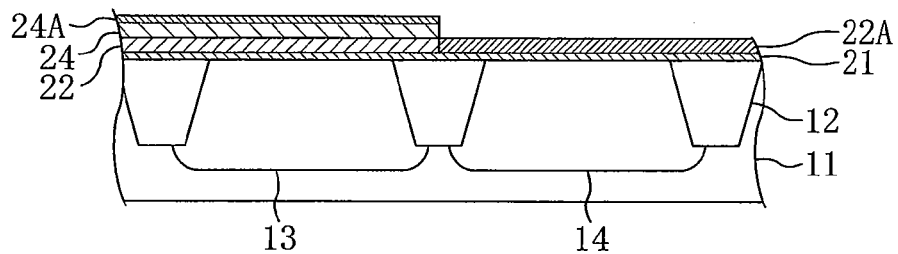
FIGS. 3A through 3D are cross-sectional views illustrating, in order of steps, the fabrication method for the semiconductor device of Embodiment 1.

Subsequently, as shown in FIG. 3A, the redundant first cap film 42 is removed. This removal may be made with an appropriate cleaner depending on the material, thickness, and the like of the first cap film 42. When an LaO film was used as the first cap film 42, 10-second cleaning may be made with a dilute hydrochloric acid (dHCl) obtained by diluting hydrochloric acid (concentration: 37 mass %) 1000 times. The dilution ratio and the cleaning time may be changed appropriately depending on the thickness of the LaO film, the heat treatment time, and the like. The first cap film 42 may not remain on the first insulating film 22 and the first electrode film 24 as diffusion of the first cap layer 42 progresses depending on a condition. In this case, it is unnecessary to remove the first cap film 42.

Figure 3B:
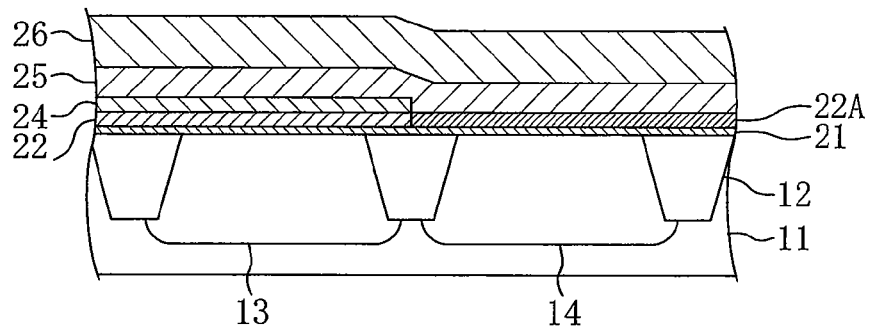

As shown in FIG. 3B, after removal of the cap material-diffused region 24A of the first electrode film 24, the second electrode film 25 made of TiN and the third electrode film 26 made of polysilicon are sequentially deposited. Subsequently, an impurity is implanted in the third electrode film 26. This impurity implantation is unnecessary if the third electrode film 26 is deposited as an impurity-doped polysilicon film.

If the cap material diffuses to as far as the second gate insulating film, the eWF of the second transistor will decrease. To prevent this, the cap material-diffused region 24A was removed. Hence, when the first electrode film 24 is sufficiently thick, or the cap material is a material less easy to diffuse, removal of the cap material-diffused region 24A is unnecessary.

It has been experimentally clarified that, when the first electrode film 24 is a TiN film and the first cap film 42 is an LaO film, La diffuses over a thickness of about 3 nm with heat treatment at 800° C. for 10 minutes. Accordingly, removal of the cap material-diffused region 24A is unnecessary when the thickness of the first electrode film 24 is 8 nm or more.

Any method may be adopted to remove the cap material-diffused region 24A as long as it can remove the cap material-diffused region 24A without degrading the insulating film 22. When the first electrode film 24 is a TiN film and the first cap film 42 is an LaO film, dilute hydrogen peroxide ($H_2O_2$) may be used for removal. Otherwise, sulfuric acid hydrogen peroxide mixture (SPM), ammonia hydrogen peroxide mixture (APM), or the like may be used.

Furthermore, the removal of the cap material-diffused region 24A and the removal of the first cap film 42 may be performed in a single step process. For example, in the case where the first electrode film 24 is a TiN film and the first cap film 42 is a LaO film, the use of diluted hydrochloric acid or hydrochloric acid-aqueous hydrogen peroxide enables continuous removal of the first cap film 42 and the cap material-diffused region 24A without necessitating change in reagent solution.

Figure 3C:
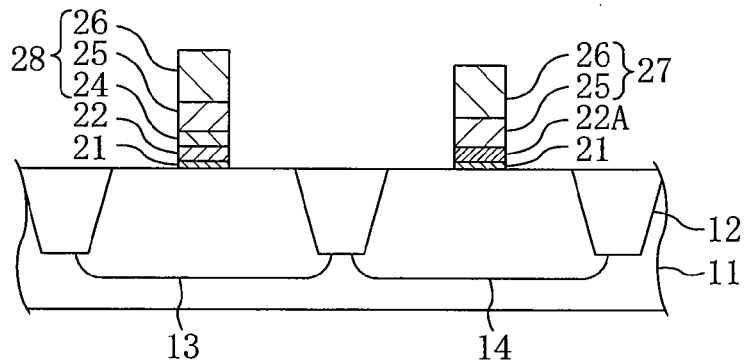

As shown in FIG. 3C, the third electrode film 26, the second electrode film 25, the cap material-diffused film 22A, and the underlying film 21 formed on the p-type active region 14 are selectively removed by lithography and reactive ion etching (RIE). Simultaneously, the third electrode film 26, the second electrode film 25, the first electrode film 24, the insulating film 22, and the underlying film 21 formed on the n-type active region 13 are selectively removed. With this selective removal, the first gate insulating film having the cap material-diffused film 22A and the first gate electrode 27 having the second electrode film 25 made of TiN and the third electrode film 26 made of polysilicon are formed on the p-type active region 14. Likewise, the second gate insulating film having the insulating film 22 and the second gate electrode 28 having the first electrode film 24 made of TiN, the second electrode film 25 made of TiN, and the third electrode film 26 made of polysilicon are formed on the n-type active region 13.

Figure 3D:
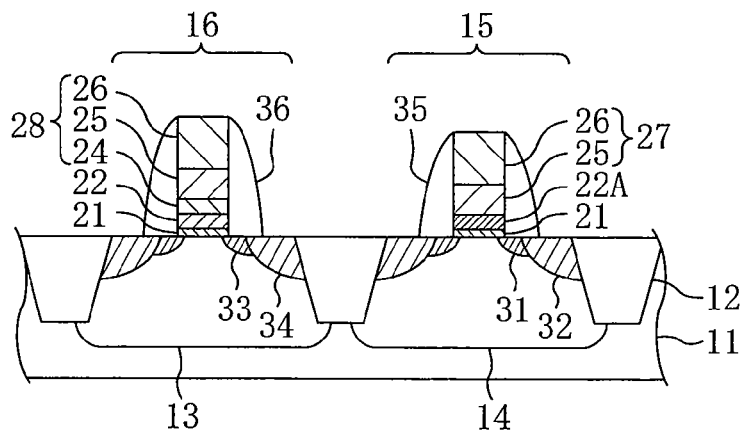

As shown in FIG. 3D, the first extension regions 31, the second extension regions 33, the first sidewalls 35, the second sidewalls 36, the first source/drain regions 32, the second source/drain regions 34, and the like are formed. An impurity implanted in the first source/drain regions 32 and the second source/drain regions 34 is then activated. In this way, the first transistor 15 as the n-MISFET is formed in the p-type active region 14, while the second transistor 16 as the p-MISFET is formed in the n-type active region 13.

Next, the principle based on which the work function of the first gate electrode 27 can be reduced without reducing the work function of the second gate electrode 28 in the semiconductor device of this embodiment will be described. Table 1 shows the values of the effective work function (eWF) of a gate electrode, the equivalent oxide thickness (EOT) of a gate insulating film, and the gate leak current density (Jg) observed when the configuration of the gate insulating film is changed. Note that as the gate electrode, a TiN film was used.

TABLE 1

|  | eWF (eV) | EOT (nm) | Jg@Vg = −1 V (A/cm$^2$) |
|---|---|---|---|
| Without LaO film | 4.67 | 1.34 | $4.0 \times 10^{-3}$ |
| With LaO film | 4.23 | 1.35 | $8.0 \times 10^{-5}$ |
| LaO film removed | 4.57 | 1.45 | $2.5 \times 10^{-3}$ |
| LaO film removed after annealing | 4.25 | 1.32 | $1.5 \times 10^{-4}$ |

As shown in Table 1, the eWF of the gate electrode was 4.67 eV when the gate insulating film included only HfSiON. However, when the gate insulating film was a multilayer film of an HfSiON film and an LaO film having a thickness of 1 nm, the value of eWF decreased to 4.23 eV. This is because of the effect of LaO of reducing eWF. When an LaO film was once formed and then removed with dHCl and a gate electrode was formed on the resultant gate insulating film, the eWF little decreased. However, when an LaO film was formed and then subjected to heat treatment at 800° C. for 10 minutes before being removed, the value of eWF decreased to about the same level as observed when the LaO film existed. In this case, also, Jg greatly decreased compared with the case of having no LaO film. This is considered because La diffused into the gate insulating film under the heat treatment.

In the fabrication method for the semiconductor device of this embodiment, first, heat treatment is performed in the state where the HfSiON film and the LaO film are in contact with each other in the first transistor 15 as the n-MISFET and the first electrode film 24 exists between the HfSiON film and the LaO film in the second transistor 16 as the p-MISFET, and thereafter, the LaO film is removed. Hence, it is possible to provide an La-diffused HfSiON film that reduces eWF as the first gate insulating film of the n-MISFET and provide a non-La insulating film that does not change eWF as the second gate insulating film of the p-MISFET, without the necessity of selective etching of the LaO film as the first cap film 42.

Moreover, the second gate electrode 28 of the p-MISFET, which includes the multilayer film of the first electrode film 24 and the second electrode film 25, is greater in height than the first gate electrode 27 of the n-MISFET. Hence, the eWF of the p-MISFET can be further increased.

In this embodiment, both the first and second gate electrodes 27 and 28 are given as a multilayer film of the TiN film and the polysilicon film. In this case, at least part of the polysilicon film may be silicided. With this, the resistance of the first and second gate electrodes 27 and 28 can be reduced. Also, as the third electrode film 26, a metal film other than the polysilicon film may be used, or otherwise the third electrode film 26 may be omitted.

The first electrode film 24 is not limited to the TiN film, but is preferably a metal film including Ti or Ta: it may be a TaN film, a TaC film, a TaCN film, or the like. Otherwise, any other metal material may be used as long as an appropriate eWF value is obtained in combination with the cap material.

The thickness of the first electrode film 24 may be changed appropriately depending on the material and the fabrication process. Note however that when both the first electrode film 24 and the second electrode film 25 are a TiN film, the total thickness of the first and second electrode films 24 and 25 should preferably be 15 nm or more to secure an appropriate eWF value in the p-MISFET.

Figure 4:
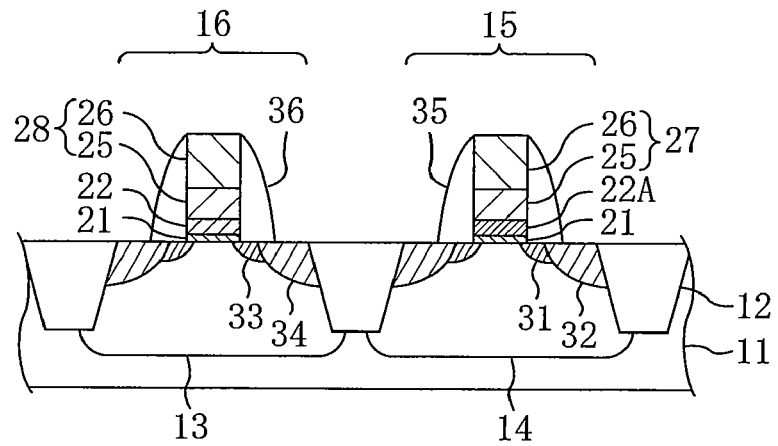
FIG. 4 is a cross-sectional view of an alteration of the semiconductor device of Embodiment 1.

In this embodiment, after the diffusion of the cap material, part of the first electrode film 24 is kept unremoved, so that the second gate electrode 28 has the multilayer film of the first electrode film 24 and the second electrode film 25. Alternatively, the first electrode film 24 may be completely removed after the diffusion of the cap material. In this case, as shown in FIG. 4, the first gate electrode 27 and the second gate electrode 28 have the same configuration.

Embodiment 2

Figure 5:
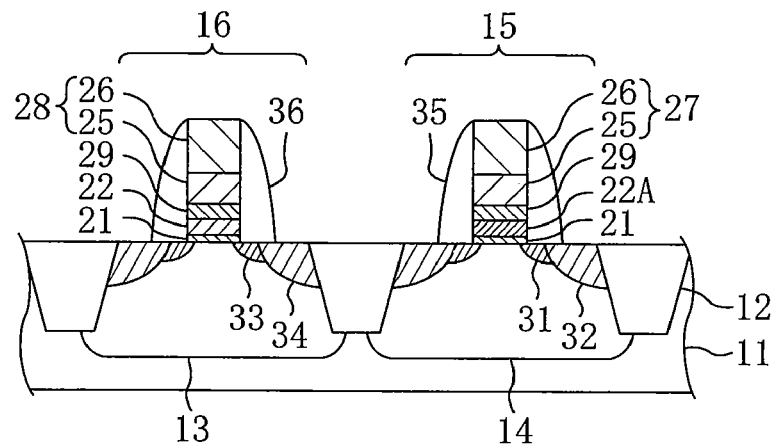
FIG. 5 is a cross-sectional view of a semiconductor device of Embodiment 2.

Embodiment 2 of the present invention will be described with reference to the relevant drawings. FIG. 5 shows a cross-sectional configuration of a semiconductor device of Embodiment 2. In FIG. 5, the same components as those in FIG. 1 are denoted by the same reference numerals, and description thereof is omitted in this embodiment.

The semiconductor device of Embodiment 2 is characterized in that a second cap film 29 is formed between the cap material-diffused film 22A and the first gate electrode 27 and between the insulating film 22 and the second gate electrode 28.

The second cap film 29 may be an aluminum oxide (AlO) film having a thickness of 1 nm. AlO has an effect of increasing the eWF of a gate electrode. However, the eWF reducing effect of LaO is greater than the eWF increasing effect of AlO. Hence, in the first transistor 15 as the n-MISFET, the eWF of the first gate electrode 27 can be kept small with the cap material-diffused film 22A containing LaO diffused therein. On the contrary, in the second transistor 16 as the p-MISFET, the eWF of the second gate electrode 28 can be increased since the eWF increasing effect of AlO is exerted with no LaO diffused in the insulating film 22.

As the second cap film 29, any insulating film having the effect of increasing the eWF of an electrode may be used. Specifically, TaO and the like may be used in place of AlO.

Figure 6A:
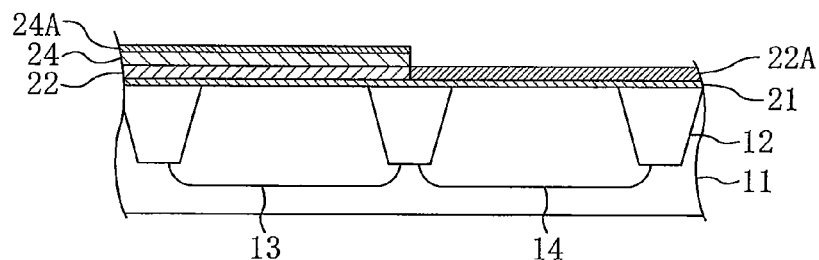
FIGS. 6A through 6D are cross-sectional views illustrating, in order of steps, a fabrication method for the semiconductor device of Embodiment 2.

The semiconductor device of Embodiment 2 may be fabricated in the following manner. First, as shown in FIG. 6A, as in Embodiment 1, the underlying film 21 and the cap material-diffused film 22A are formed on the p-type active region 14, and the underlying film 21, the insulating film 22, and the first electrode film 24 having the cap material-diffused region 24A in its top portion are formed on the n-type active region 13.

Figure 6B:
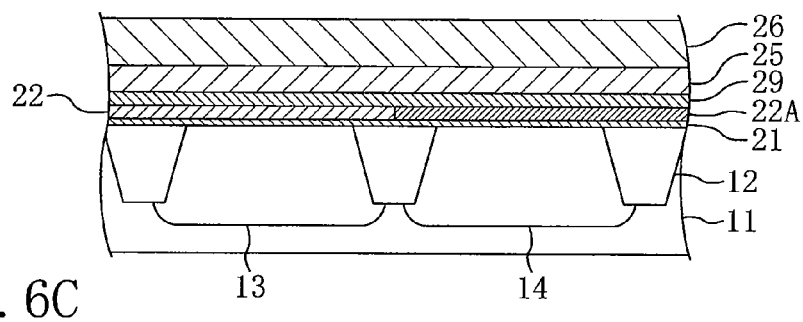

Thereafter, as shown in FIG. 6B, after removal of the first electrode film 24, the second cap film 29 made of AlO is formed on the entire surface of the semiconductor substrate. Subsequently, the second electrode film 25 made of TiN and the third electrode film 26 made of polysilicon are formed.

Figure 6C:
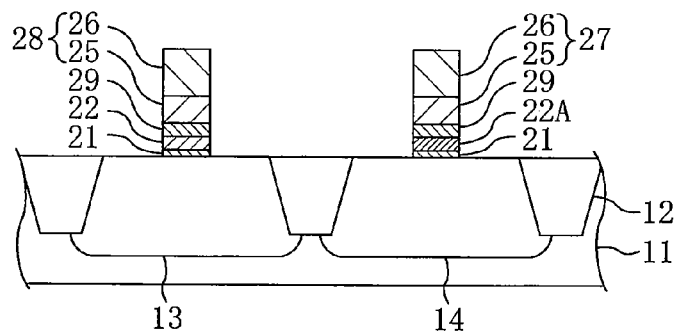

As shown in FIG. 6C, the third electrode film 26, the second electrode film 25, the second cap film 29, the cap material-diffused film 22A, and the underlying film 21 formed on the p-type active region 14 are selectively removed by lithography and RIE. Simultaneously, the third electrode film 26, the second electrode film 25, the second cap film 29, the insulating film 22, and the underlying film 21 formed on the n-type active region 13 are selectively removed. With this selective removal, the first gate insulating film having the cap material-diffused film 22A and the second cap film 29 and the first gate electrode 27 having the second electrode film 25 made of TiN and the third electrode film 26 made of polysilicon are formed on the p-type active region 14. Likewise, the second gate insulating film having the insulating film 22 and the second cap film 29 and the second gate electrode 28 having the second electrode film 25 made of TiN and the third electrode film 26 made of polysilicon are formed on the n-type active region 13.

Figure 6D:
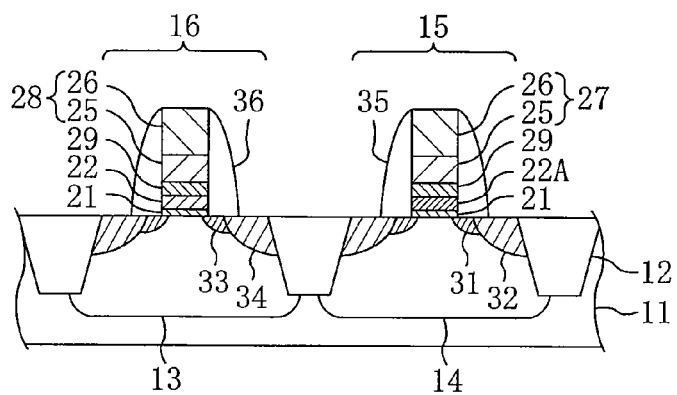

As shown in FIG. 6D, the first extension regions 31, the second extension regions 33, the first sidewalls 35, the second sidewalls 36, the first source/drain regions 32, the second source/drain regions 34, and the like are formed. An impurity implanted in the first source/drain regions 32 and the second source/drain regions 34 are then activated. In this way, the first transistor 15 as the n-MISFET is formed in the p-type active region 14, while the second transistor 16 as the p-MISFET is formed in the n-type active region 13.

Embodiment 3

Figure 7:
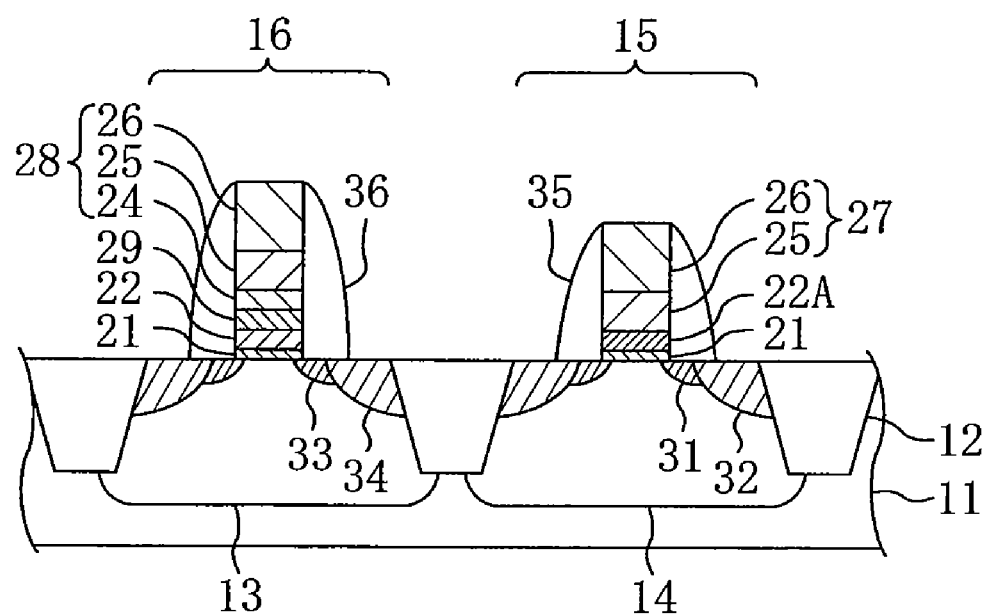
FIG. 7 is a cross-sectional view of a semiconductor device of Embodiment 3.

Embodiment 3 of the present invention will be described with reference to the relevant drawings. FIG. 7 shows a cross-sectional configuration of a semiconductor device of Embodiment 3. In FIG. 7, the same components as those in FIG. 1 are denoted by the same reference numerals, and description thereof is omitted in this embodiment.

The semiconductor device of Embodiment 3 is characterized in that, while the second cap film 29 is not formed in the first transistor 15 as the n-MISFET, the second cap film 29 is formed between the insulating film 22 and the second gate electrode 28 in the second transistor 16 as the p-MISFET.

With the second cap film 29 formed only in the second transistor 16 as the p-MISFET, the eWF of the p-MISFET can be increased reliably without the possibility of increasing the eWF of the first transistor 15 as the n-MISFET.

Figure 8A:
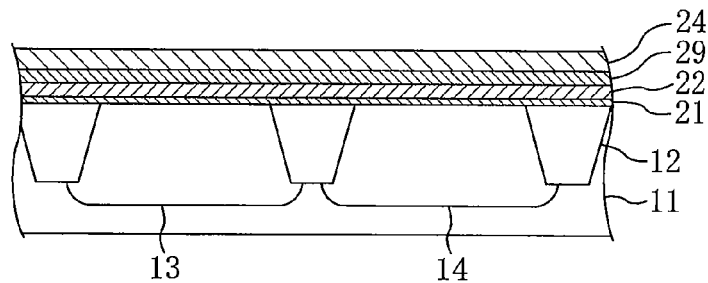
FIGS. 8A through 8D are cross-sectional views illustrating, in order of steps, a fabrication method for the semiconductor device of Embodiment 3.

The semiconductor device of Embodiment 3 may be fabricated as follows. First, as shown in FIG. 8A, the n-type active region 13 and the p-type active region 14 isolated from each other with the element isolation region 12 are formed on the semiconductor substrate 11 made of silicon. Subsequently, the underlying film 21 made of $SiO_2$ having a thickness of 1 nm, the insulating film 22 made of HfSiON having a thickness of 2.5 nm, the second cap film 29 made of AlO having a thickness of 1 nm, and the first electrode film 24 made of TiN having a thickness of 5 nm are sequentially formed on the semiconductor substrate 11.

The underlying film 21 may be formed by RTO using oxygen gas. In place of RTO, heat treatment using a heat oven may be adopted, and a gas species other than the oxygen gas may be used. Also, in place of the thermal oxide film, a chemical oxide film and the like, or even an SiON film, may be used.

The insulating film 22 may be formed by depositing an HfSiO film by MOCVD, ALD, or the like and then subjecting the HfSiO film to plasma nitriding to form an HfSiON film. In place of the HfSiON film, any other high dielectric constant film such as an aluminum oxide ($Al_2O_3$) film, a zirconium oxide ($ZrO_2$) film, a hafnium oxide ($HfO_2$) film, a scandium oxide (ScO) film, or the like may be used. Alternatively, depending on the material of a cap film to be described later, a lanthanoid series insulating film such as a lanthanum oxide (LaO) film, a dysprosium oxide (DyO) film, or the like can be used. Otherwise, an $SiO_2$ film, an SiON film, or the like, which is not a high dielectric, may be used depending on the use. Also, in place of MOCVD, chemical vapor deposition (CVD), physical vapor deposition (PVD), and the like may be adopted.

Figure 8B:
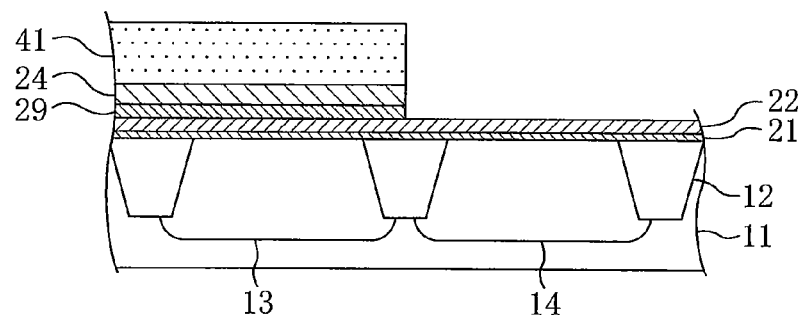

As shown in FIG. 8B, a resist film 41 is formed covering the n-type active region 13. Thereafter, using the resist film 41 as the mask, the portions of the first electrode film 24 and the second cap film 29 formed on the p-type active region 14 are removed. Note that the second cap film 29 may not be removed if the properties of the first transistor 15 including the second cap film 29 are acceptable.

Figure 8C:
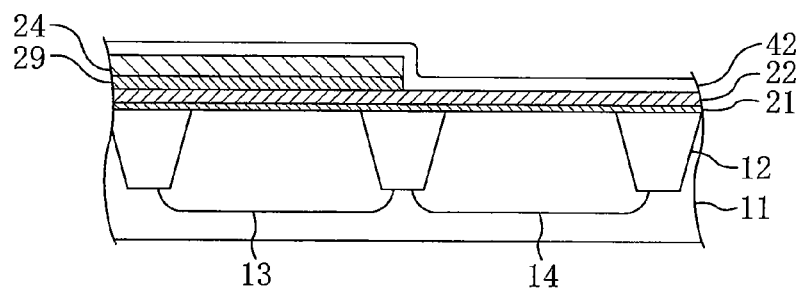

As shown in FIG. 8C, after removal of the resist film 41 by cleaning with a thinner, a first cap film 42 made of LaO having a thickness of 1 nm is formed on the resultant semiconductor substrate 11.

Figure 8D:
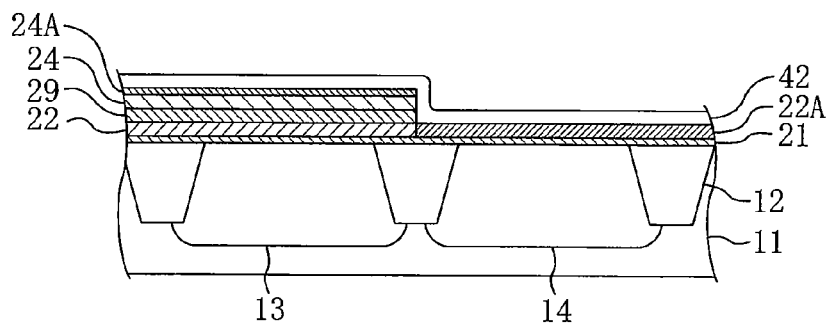

As shown in FIG. 8D, heat treatment is performed at 800° C. for 10 minutes, whereby LaO thermally diffuses, changing the portion of the insulating film 22 formed on the p-type active region 14 to a cap material-diffused film 22A containing LaO. Also, a cap material-diffused region 24A containing LaO is formed in the top portion of the first electrode film 24.

The first cap film 42, which may just be an insulating film having the effect of reducing the eWF of an electrode, may be made of an oxide of a lanthanoid series element such as DyO, or made of ScO, magnesium oxide (MgO), or the like. The thickness of the first cap film 42 may be changed depending on the value of eWF required. Specifically, the first cap film 42 may be made thick for further reducing eWF, and may be made thin for setting eWF at a higher value. The temperature and time of the heat treatment may be changed appropriately depending on the thickness of the insulating film 22 and the value of eWF required.

Figure 9A:
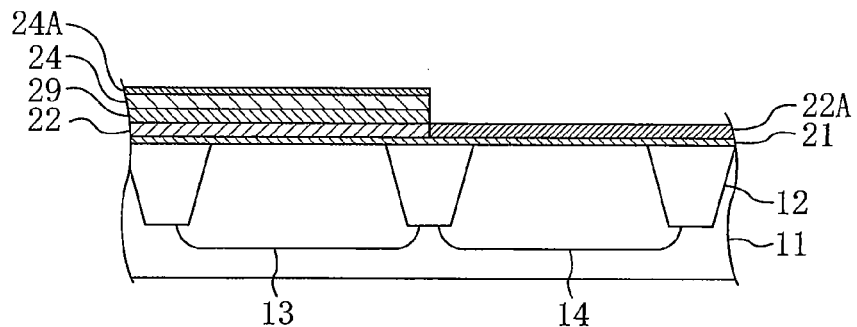
FIGS. 9A through 9D are cross-sectional views illustrating, in order of steps, the fabrication method for the semiconductor device of Embodiment 3.

Subsequently, as shown in FIG. 9A, the redundant first cap film 42 is removed. This removal may be made with an appropriate cleaner depending on the material, thickness, and the like of the first cap film 42. When an LaO film was used as the first cap film 42, 10-second cleaning may be made with a dilute hydrochloric acid (dHCl) obtained by diluting hydrochloric acid (concentration: 37 mass %) 1000 times. The dilution ratio and the cleaning time may be changed appropriately depending on the thickness of the LaO film, the heat treatment time, and the like.

Figure 9B:
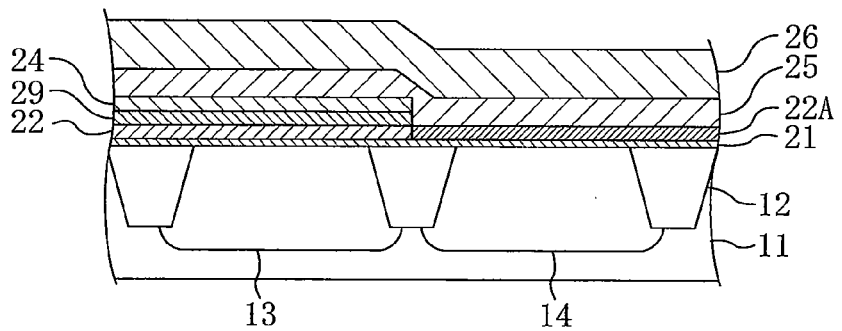

As shown in FIG. 9B, after removal of the cap material-diffused region 24A in the first electrode film 24, the second electrode film 25 made of TiN and the third electrode film 26 made of polysilicon are sequentially deposited. Subsequently, an impurity is implanted in the third electrode film 26. This impurity implantation is unnecessary if the third electrode film 26 is deposited as an impurity-doped polysilicon film.

If the cap material diffuses to as far as the second gate insulating film, the eWF of the second transistor will decrease. To prevent this, the cap material-diffused region 24A was removed. Hence, when the first electrode film 24 is sufficiently thick, or the cap material is a material less easy to diffuse, removal of the cap material-diffused region 24A is unnecessary.

It has been experimentally clarified that, when the first electrode film 24 is a TiN film and the first cap film 42 is an LaO film, La diffuses over a thickness of about 3 nm with heat treatment at 800° C. for 10 minutes. Accordingly, removal of the cap material-diffused region 24A is unnecessary when the thickness of the first electrode film 24 is 8 nm or more.

Any method may be adopted to remove the cap material-diffused region 24A as long as it can remove the cap material-diffused region 24A without degrading the insulating film 22. When the first electrode film 24 is a TiN film and the first cap film 42 is an LaO film, dilute hydrogen peroxide ($H_2O_2$) may be used for removal. Alternatively, sulfuric acid hydrogen peroxide mixture (SPM), ammonia hydrogen peroxide mixture (APM), or the like may be used.

Figure 9C:
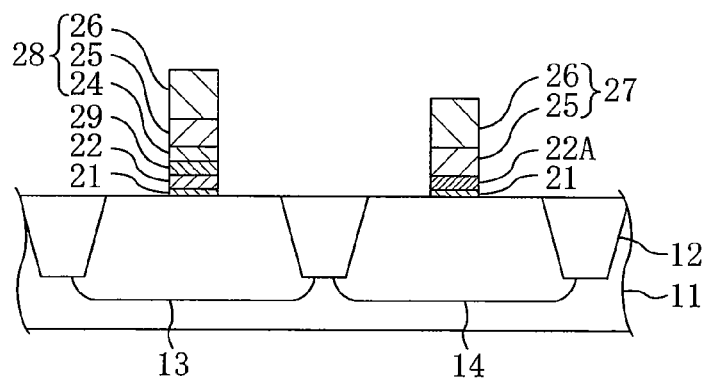

As shown in FIG. 9C, the third electrode film 26, the second electrode film 25, the cap material-diffused film 22A, and the underlying film 21 formed on the p-type active region 14 are selectively removed by lithography and RIE. Simultaneously, the third electrode film 26, the second electrode film 25, the first electrode film 24, the second cap film 29, the insulating film 22, and the underlying film 21 formed on the n-type active region 13 are selectively removed. With this selective removal, the first gate insulating film having the cap material-diffused film 22A and the first gate electrode 27 having the second electrode film 25 made of TiN and the third electrode film 26 made of polysilicon are formed on the p-type active region 14. Likewise, the second gate insulating film having the insulating film 22 and the second cap film 29 and the second gate electrode 28 having the first electrode film 24 made of TiN, the second electrode film 25 made of TiN, and the third electrode film 26 made of polysilicon are formed on the n-type active region 13.

Figure 9D:
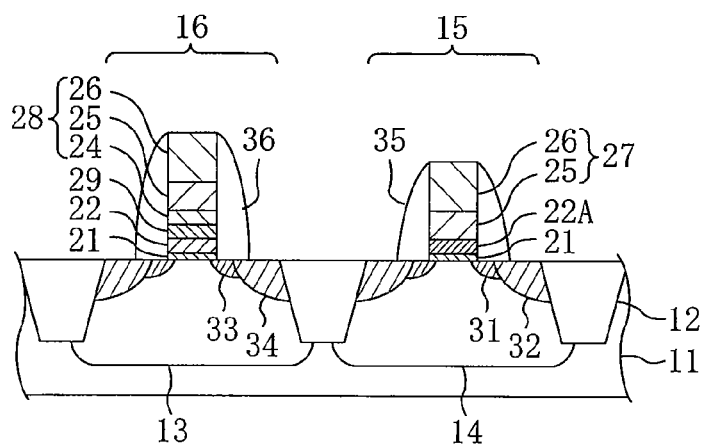

As shown in FIG. 9D, the first extension regions 31, the second extension regions 33, the first sidewalls 35, the second sidewalls 36, the first source/drain regions 32, the second source/drain regions 34, and the like are formed. An impurity implanted in the first source/drain regions 32 and the second source/drain regions 34 is then activated. In this way, the first transistor 15 as the n-MISFET is formed in the p-type active region 14, while the second transistor 16 as the p-MISFET is formed in the n-type active region 13.

Figure 10A:
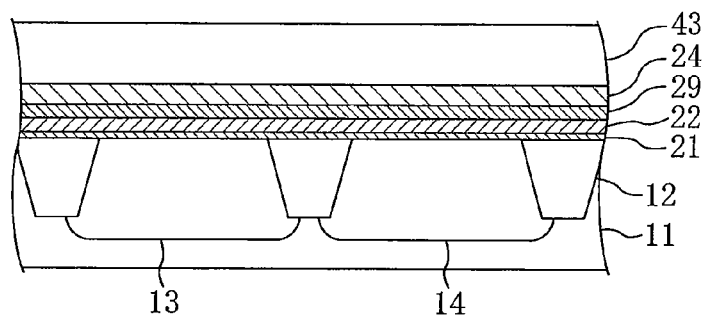
FIGS. 10A through 10D are cross-sectional views illustrating, in order of steps, an alteration of the fabrication method for the semiconductor device of Embodiment 3.

Alternatively, the semiconductor device of Embodiment 3 may be fabricated in the following manner. First, as shown in FIG. 10A, the n-type active region 13 and the p-type active region 14 isolated from each other with the element isolation region 12 are formed on the semiconductor substrate 11 made of silicon. Subsequently, the underlying film 21 made of SiO$_2$ having a thickness of 1 nm, the insulating film 22 made of HfSiON having a thickness of 2.5 nm, the second cap film 29 made of AlO having a thickness of 1 nm, the first electrode film 24 made of TiN having a thickness of 5 nm, and a hard mask 43 are sequentially formed on the semiconductor substrate 11.

The hard mask 43 may be made of any material as long as the material can be easily removed together with the first cap film to be formed later and does not affect the electrical properties and workability of the first electrode film. For example, AlO and the like may be used.

Figure 10B:
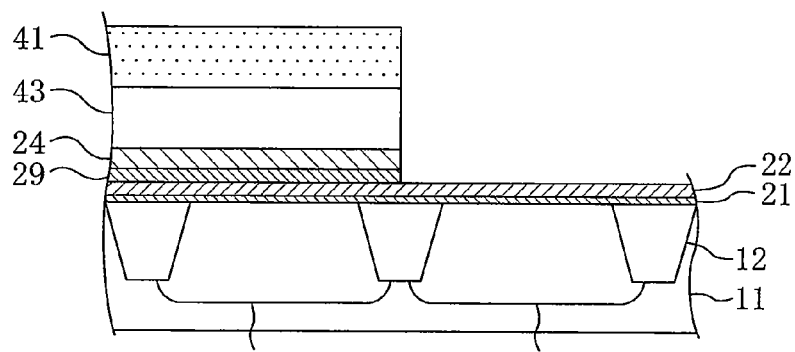

As shown in FIG. 10B, a resist film 41 is formed covering the n-type active region 13. Thereafter, using the resist film 41 as the mask, the portions of the hard mask 43, the first electrode film 24, and the second cap film 29 formed on the p-type active region 14 are removed.

Figure 10C:
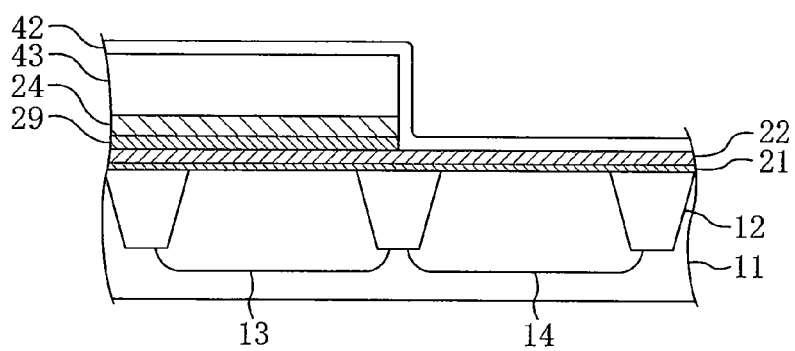

As shown in FIG. 10C, after removal of the resist film 41 by cleaning with a thinner, the first cap film 42 made of LaO having a thickness of 1 nm is formed on the resultant semiconductor substrate 11.

Figure 10D:
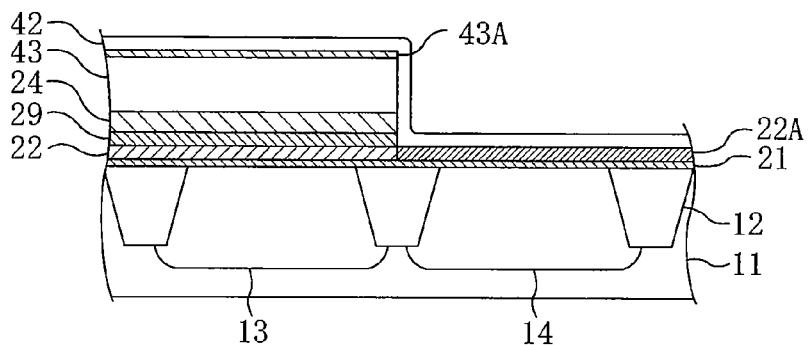

As shown in FIG. 10D, heat treatment is performed at 800° C. for 10 minutes, whereby LaO thermally diffuses, changing the portion of the insulating film 22 formed on the p-type active region 14 to the cap material-diffused film 22A containing LaO. Also, a cap material-diffused region 43A containing LaO is formed in the top portion of the hard mask 43.

Subsequently, as shown in FIG. 1A, the redundant first cap film 42 is removed. This removal may be made with an appropriate cleaner depending on the material, thickness, and the like of the first cap film 42. When an LaO film was used as the first cap film 42, 10-second cleaning may be made with a dilute hydrochloric acid (dHCl) obtained by diluting hydrochloric acid (concentration: 37 mass %) 1000 times. The dilution ratio and the cleaning time may be changed appropriately depending on the thickness of the LaO film, the heat treatment time, and the like. When the hard mask 43 is an AlO film, the hard mask 43 is removed simultaneously. The hard mask 43 may be removed separately depending on the material thereof.

Figure 11A:
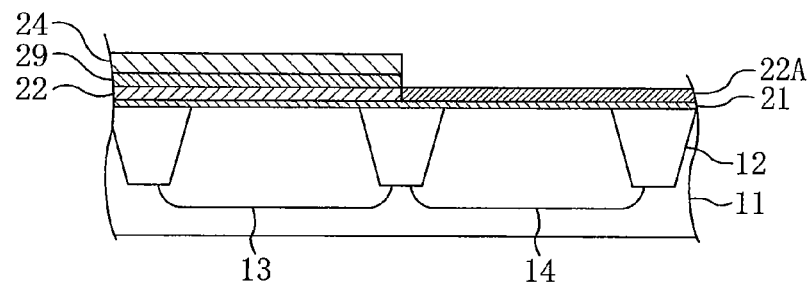
FIGS. 11A through 11D are cross-sectional views illustrating, in order of steps, the alteration of the fabrication method for the semiconductor device of Embodiment 3.
Figure 11B:
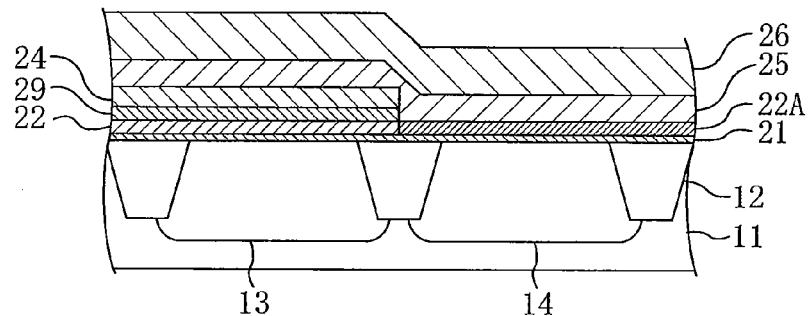

As shown in FIG. 11B, the second electrode film 25 made of TiN and the third electrode film 26 made of polysilicon are sequentially deposited. Subsequently, an impurity is implanted in the third electrode film 26. This impurity implantation is unnecessary if the third electrode film 26 is deposited as an impurity-doped polysilicon film.

Figure 11C:
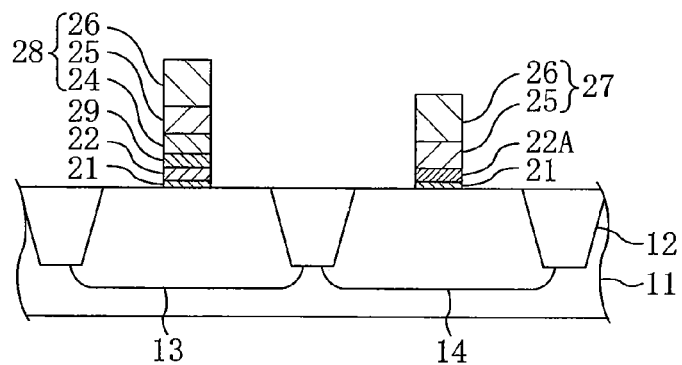

As shown in FIG. 11C, the third electrode film 26, the second electrode film 25, the cap material-diffused film 22A, and the underlying film 21 formed on the p-type active region 14 are selectively removed by lithography and RIE. Simultaneously, the third electrode film 26, the second electrode film 25, the first electrode film 24, the second cap film 29, the insulating film 22, and the underlying film 21 formed on the n-type active region 13 are selectively removed. With this selective removal, the first gate insulating film having the cap material-diffused film 22A and the first gate electrode 27 having the second electrode film 25 made of TiN and the third electrode film 26 made of polysilicon are formed on the p-type active region 14. Likewise, the second gate insulating film having the insulating film 22 and the second cap film 29 and the second gate electrode 28 having the first electrode film 24 made of TiN, the second electrode film 25 made of TiN, and the third electrode film 26 made of polysilicon are formed on the n-type active region 13.

Figure 11D:
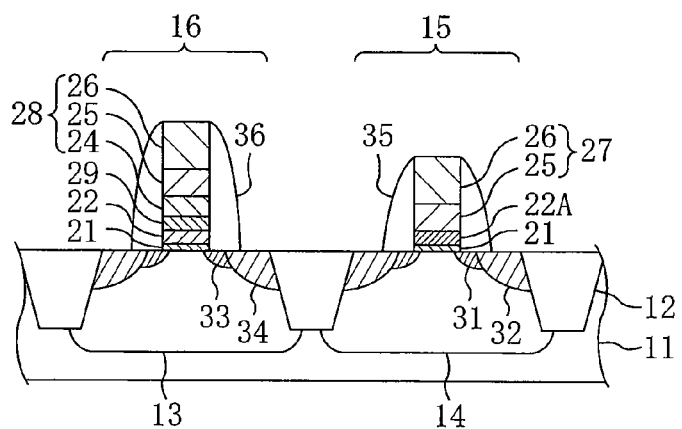

As shown in FIG. 11D, the first extension regions 31, the second extension regions 33, the first sidewalls 35, the second sidewalls 36, the first source/drain regions 32, the second source/drain regions 34, and the like are formed. An impurity implanted in the first source/drain regions 32 and the second source/drain regions 34 is then activated. In this way, the first transistor 15 as the n-MISFET is formed in the p-type active region 14 while the second transistor 16 as the p-MISFET is formed in the n-type active region 13.

With the above configuration, since there is little possibility that the cap material may diffuse into the first electrode film 24, removal of part of the first electrode film 24 is unnecessary. Hence, the TiN film portion of the second gate electrode 28 can be thickened. Note that the fabrication method using a hard mask can also be applied to the case of not forming the second cap film 29.

Embodiment 4

Figure 12:
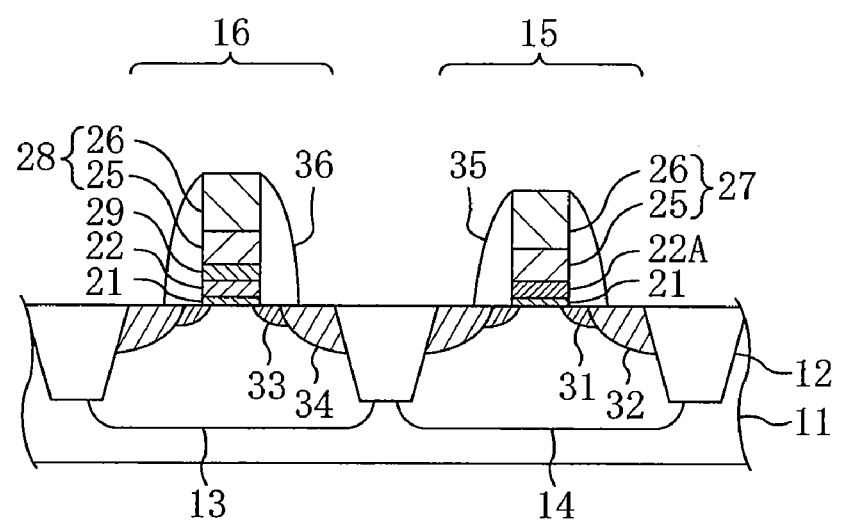
FIG. 12 is a cross-sectional view of a semiconductor device of Embodiment 4.

Embodiment 4 of the present invention will be described with reference to the relevant drawings. FIG. 12 shows a cross-sectional configuration of a semiconductor device of Embodiment 4. In FIG. 12, the same components as those in FIG. 7 are denoted by the same reference numerals, and description thereof is omitted in this embodiment.

In the semiconductor device of Embodiment 4, unlike the semiconductor device of Embodiment 3, the first gate electrode 27 of the first transistor 15 as the n-MISFET and the second gate electrode 28 of the second transistor 16 as the p-MISFET have the same configuration. Specifically, both the first gate electrode 27 and the second gate electrode 28 are formed of a multilayer film of the second electrode film 25 and the third electrode film 26.

Figure 13A:
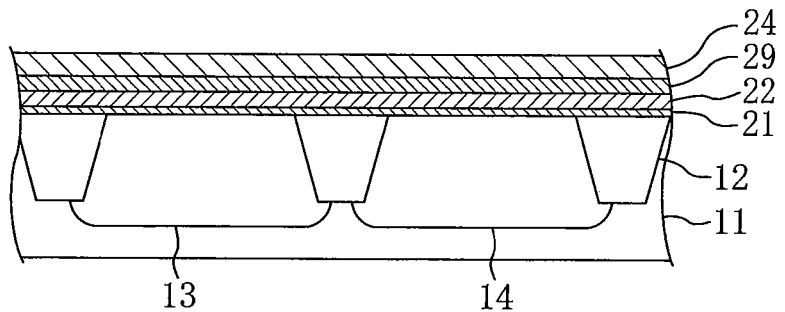
FIGS. 13A through 13D are cross-sectional views illustrating, in order of steps, a fabrication method for the semiconductor device of Embodiment 4.

The semiconductor device of Embodiment 4 may be fabricated as follows. First, as shown in FIG. 13A, the n-type active region 13 and the p-type active region 14 isolated from each other with the element isolation region 12 are formed on the semiconductor substrate 11 made of silicon. Subsequently, the underlying film 21 made of SiO$_2$ having a thickness of 1 nm, the insulating film 22 made of HfSiON having a thickness of 2.5 nm, the second cap film 29 made of AlO having a thickness of 1 nm, and the first electrode film 24 made of TiN having a thickness of 5 nm are sequentially formed on the semiconductor substrate 11.

The underlying film 21 may be formed by RTO using oxygen gas. In place of RTO, heat treatment using a heat oven may be adopted, and a gas species other than the oxygen gas may be used. Also, in place of the thermal oxide film, a chemical oxide film and the like, or even an SiON film, may be used.

The insulating film 22 may be formed by depositing an HfSiO film by MOCVD, ALD, or the like and then subjecting the HfSiO film to plasma nitriding to form an HfSiON film. In place of the HfSiON film, any other high dielectric constant film such as an aluminum oxide ($Al_2O_3$) film, a zirconium oxide ($ZrO_2$) film, a hafnium oxide ($HfO_2$) film, a scandium oxide (ScO) film, or the like may be used. Alternatively, depending on the material of a cap film to be described later, a lanthanoid series insulating film such as a lanthanum oxide (LaO) film, a dysprosium oxide (DyO) film, or the like can be used. Otherwise, an $SiO_2$ film, an SiON film, or the like, which is not a high dielectric, may be used depending on the use. Also, in place of MOCVD, chemical vapor deposition (CVD), physical vapor deposition (PVD), and the like may be adopted.

Figure 13B:
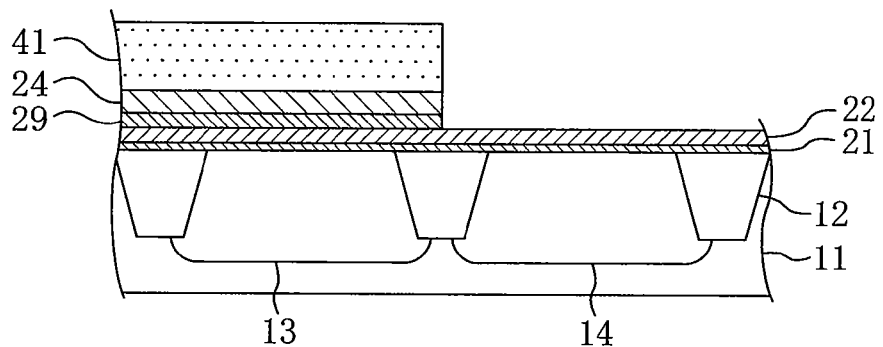

As shown in FIG. 13B, a resist film 41 is formed covering the n-type active region 13. Thereafter, using the resist film 41 as the mask, the portions of the first electrode film 24 and the second cap film 29 formed on the p-type active region 14 are removed. Note that the second cap film 29 may not be removed if the properties of the first transistor 15 including the second cap film 29 are acceptable.

Figure 13C:
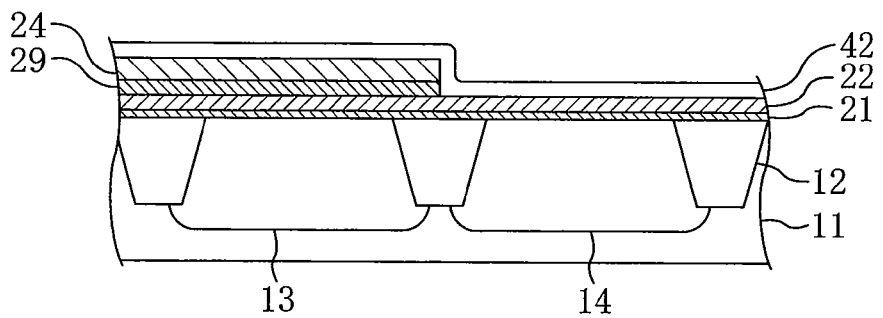

As shown in FIG. 13C, after removal of the resist film 41 by cleaning with a thinner, a first cap film 42 made of LaO having a thickness of 1 nm is formed on the resultant semiconductor substrate 11.

Figure 13D:
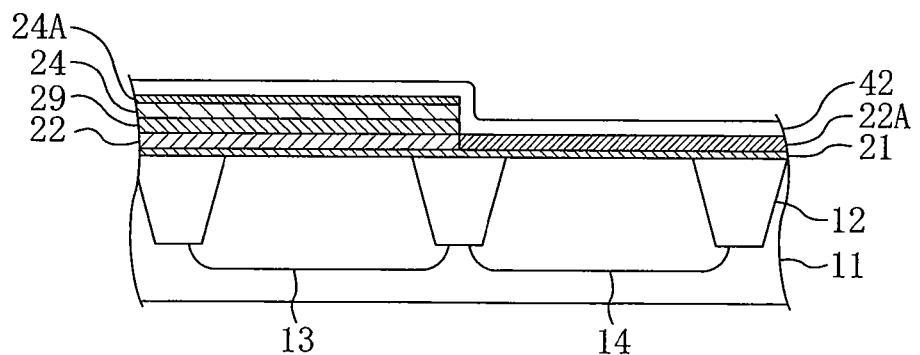

As shown in FIG. 13D, heat treatment is performed at 800° C. for 10 minutes, whereby LaO thermally diffuses, changing the portion of the insulating film 22 formed on the p-type active region 14 to a cap material-diffused film 22A containing LaO. Also, a cap material-diffused region 24A in which LaO diffuses is formed in the top portion of the first electrode film 24. In the case where the first electrode film 24 is made of TiN and the first cap film 42 is LaO, the cap material-diffused region 24A is a TiN film in which LaO thermally diffuses (a titanium lanthanum nitride film).

The first cap film 42, which may just be an insulating film having the effect of reducing the eWF of an electrode, may be made of an oxide of a lanthanoid series element such as DyO, or made of ScO, magnesium oxide (MgO), or the like. The thickness of the first cap film 42 may be changed depending on the value of eWF required. Specifically, the first cap film 42 may be made thick for further reducing eWF, and may be made thin for setting eWF at a higher value. The temperature and time of the heat treatment may be changed appropriately depending on the thickness of the insulating film 22 and the value of eWF required.

Figure 14A:
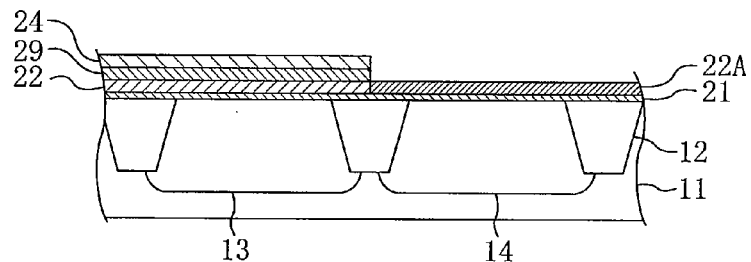
FIGS. 14A through 14D are cross-sectional views illustrating, in order of steps, the fabrication method for the semiconductor device of Embodiment 4.

Subsequently, as shown in FIG. 14A, the redundant first cap film 42 and cap material-diffused region 24A are removed. This removal may be made with an appropriate cleaner depending on the materials, thicknesses, and the like of the first cap film 42 and the cap material-diffused region 24A. Where a LaO film is used as the first cap film 42 and a TiN film is used as the first electrode film 24, cleaning using a mixed solution of diluted hydrochloric acid and hydrogen peroxide enables removal of the first cap film 24 and the cap material-diffused region 24A in a single step process using the same reagent solution. The first cap film 24 and the cap material-diffused region 24A may be removed in separate step processes. For example, the cap material-diffused region 24A may be removed using aqueous hydrogen peroxide, SPM, APM, or the like after the first cap film 42 of LaO is removed using diluted hydrochloric acid. Alternatively, where the first cap film 42 does not remain on the insulating film 22 and the first electrode film 24 as diffusion of the first cap film 42 proceeds, the removal of the first cap film 24 may be omitted.

Figure 14B:
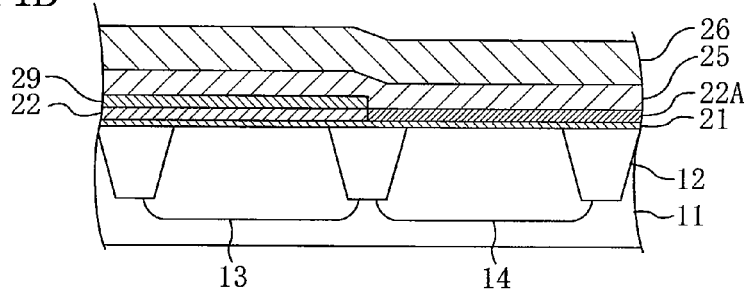

As shown in FIG. 14B, after removal of the cap material-diffused region 24A and the first electrode film 24, the second electrode film 25 made of TiN and the third electrode film 26 made of polysilicon are sequentially deposited. Subsequently, an impurity is implanted in the third electrode film 26. This impurity implantation is unnecessary if the third electrode film 26 is deposited as an impurity-doped polysilicon film.

When the first electrode film 24 is a TiN film, the first electrode film 24 can be easily removed by using aqueous hydrogen peroxide ($H_2O_2$), sulfuric acid hydrogen peroxide mixture (SPM), ammonia hydrogen peroxide mixture (APM), or the like. The first electrode film 24 may be removed in a single step process as the removal as the first cap film 42 and the cap material-diffused region 24A with the use of the same reagent solution.

Figure 14C:
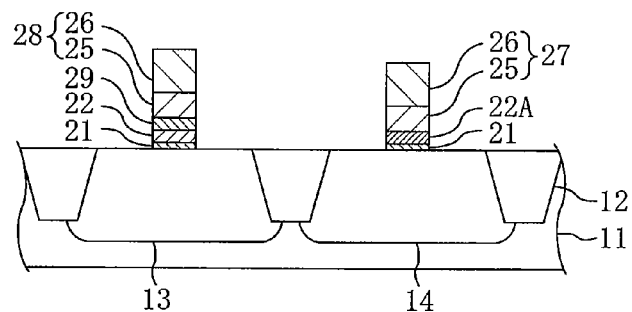

As shown in FIG. 14C, the third electrode film 26, the second electrode film 25, the cap material-diffused film 22A, and the underlying film 21 formed on the p-type active region 14 are selectively removed by lithography and RIE. Simultaneously, the third electrode film 26, the second electrode film 25, the second cap film 29, the insulating film 22, and the underlying film 21 formed on the n-type active region 13 are selectively removed. With this selective removal, the first gate insulating film having the cap material-diffused film 22A and the first gate electrode 27 having the second electrode film 25 made of TiN and the third electrode film 26 made of polysilicon are formed on the p-type active region 14. Likewise, the second gate insulating film having the insulating film 22 and the second cap film 29 and the second gate electrode 28 having the second electrode film 25 made of TiN and the third electrode film 26 made of polysilicon are formed on the n-type active region 13.

Figure 14D:
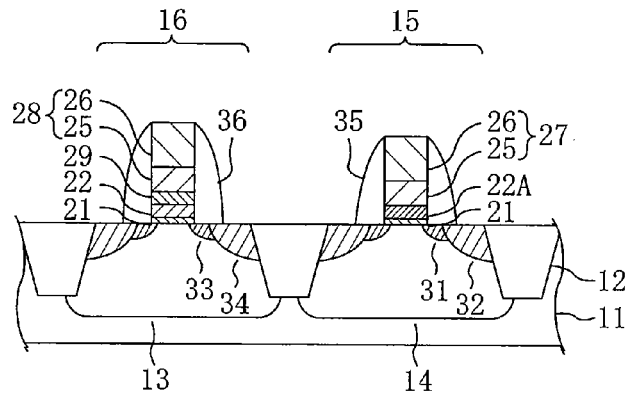

As shown in FIG. 14D, the first extension regions 31, the second extension regions 33, the first sidewalls 35, the second sidewalls 36, the first source/drain regions 32, the second source/drain regions 34, and the like are formed. An impurity implanted in the first source/drain regions 32 and the second source/drain regions 34 is then activated. In this way, the first transistor 15 as the n-MISFET is formed in the p-type active region 14, while the second transistor 16 as the p-MISFET is formed in the n-type active region 13.

When the second electrode film 25 is formed on the first electrode film 24, a very thin layer containing oxygen may possibly be formed at the interface between the first electrode film 24 and the second electrode film 25. This may cause a resistance at the interface, possibly increasing the gate resistance of the second gate electrode 28. In this embodiment, however, in which not only the cap material-diffused region 24A but also the first electrode film 24 remaining on the n-type active region are entirely removed after the diffusion of the first cap film 42. Hence, there is no possibility of increase of the gate resistance of the second gate electrode 28. Also, with the removal of the first electrode film, the first gate electrode 27 and the second gate electrode 28 are the same in configuration and hence can be made identical in thickness. This provides the effect of facilitating the electrode film etching process.

Note that the semiconductor device of this embodiment may otherwise be fabricated by diffusing the first cap film 42 according to the fabrication method using a hard mask described in Embodiment 3 and then removing the first electrode film 24 remaining on the n-type active region.

In Embodiment 4, although the first electrode 24 and the second electrode 25 were formed of the same material as an example, they may be formed of different materials from each other.

The fabrication methods of the above embodiments do not involve partial removal of the insulating film 22 and the second electrode film 25. Hence, when the fabrication methods of the embodiments are applied to a static RAM (S-RAM) and the like, the cap material-diffused film 22A and the insulating film 22 are continuous with no gap therebetween at the boundary between the n-MISFET and the p-MISFET on the element isolation region. Also, the second electrode film 25 is continuous.

In the above embodiments, described was the case that the first transistor 15 was an n-MISFET and the second transistor 16 was a p-MISFET, for example. However, if a material having the effect of increasing eWF is used for the first cap film 42, the first transistor 15 can be a p-MISFET while the second transistor 16 an n-MISFET. In this case, the first cap film 42 may be made of AlO or TaO, and the first electrode film 24 and the second electrode film 25 may be made of a metal low in eWF such as TaN, TaC, HfC, or the like.

The present invention is applicable, not only to the case that the first transistor 15 and the second transistor 16 have different conductivity types from each other, but also to the case that they have the same conductivity type.

In the embodiments described above, although a silicon substrate was used as the semiconductor substrate 11, a substrate made of a material other than silicon may be used. For example, a semiconductor oxide insulator (SOI) substrate or a substrate made of a mixed crystal material such as a gallium arsenic (GaAs) substrate or an indium phosphorus (InP) substrate may be used.

As described above, the present disclosure can implement a semiconductor device in which the cap film effect is given to only a transistor of one conductivity type without the necessity of increasing the number of process steps, and hence is useful for a semiconductor device having two types of especially miniaturized transistors and a fabrication method for the same.

The description of the embodiments of the present invention is given above for the understanding of the present invention. It will be understood that the invention is not limited to the particular embodiments described herein, but is capable of various modification, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A fabrication method for a semiconductor device, comprising the steps of:
    (a) forming an insulating film and a first electrode film sequentially in this order on the entire surface of a semiconductor substrate having a first region and a second region;
    (b) removing a portion of the first electrode film formed on the first region;
    (c) forming a first cap film containing a first element over the semiconductor substrate and thereafter subjecting the resultant substrate to heat treatment after the step (b), to allow the first element to diffuse into a portion of the insulating film formed on the first region and at least a top portion of the first electrode film;
    (d) forming a second electrode film over the semiconductor substrate after the step (c); and
    (e) etching at least the second electrode film and the insulating film, to form a first gate insulating film including the insulating film with the first element diffused therein and a first gate electrode including the second electrode film on the first region, and form a second gate insulating film including the insulating film and a second gate electrode including the second electrode film on the second region.

2. The fabrication method for a semiconductor device of claim 1, further comprising the step of (f) removing together with the first cap film a region of the first electrode film containing the first element diffused therein before the step (c) and after the step (d),
    wherein in the step (e), the second gate electrode including the second electrode film and the remainder of the first electrode film is formed.

3. The fabrication method for a semiconductor device of claim 1, wherein in the step (a), a second cap film containing a second element is formed between the insulating film and the first electrode film, and
    in the step (e), the second gate insulating film including the insulating film and the second cap film is formed.

4. The fabrication method for a semiconductor device of claim 3, wherein the second element is aluminum or tantalum.

5. The fabrication method for a semiconductor device of claim 1, further comprising the step of (g) removing the first cap film and the first electrode film between the step (c) and the step (d),
    wherein in the step (d), a second cap film containing a second element is formed over the semiconductor substrate, and then the second electrode film is formed, and
    in the step (e), the first gate insulating film including the insulating film with the first element diffused therein and the second cap film is formed, and the second gate insulating film including the insulating film and the second cap film is formed.

6. The fabrication method for a semiconductor device of claim 1, further comprising the steps of:
    (h) removing together with the first cap film a region of the first electrode film containing the first element diffused therein in the second region after the step (c) and before the step (d); and
    (i) removing a part where the first electrode film remains in the second region after the step (i) and before the step (d),
    wherein in the step (a), a second cap film containing a second element is formed between the insulating film and the first electrode film, and
    in the step (e), the second gate insulating film including the insulating film and the second cap film is formed.

7. The fabrication method form a semiconductor device of claim 6, wherein the step (h) and the step (i) is a continuous single step.

8. The fabrication method for a semiconductor device of claim 1, wherein the first element is lanthanum.

9. The fabrication method for a semiconductor device of claim 1, wherein the first electrode film and the second electrode film are made of titanium nitride.

10. A fabrication method for a semiconductor device, comprising the steps of:

(a) forming an insulating film, a first electrode film, and a hard mask sequentially in this order on the entire surface of a semiconductor substrate having a first region and a second region;
(b) removing a portion of the hard mask formed on the first region;
(c) forming a first cap film containing a first element over the semiconductor substrate and thereafter subjecting the resultant substrate to heat treatment after the step (b), to allow the first element to diffuse into a portion of the insulating film formed on the first region and at least a top portion of the hard mask;
(d) removing the first cap film and the hard mask after the step (c);
(e) forming a second electrode film over the semiconductor substrate after the step (d); and
(f) etching at least the second electrode film, the first electrode film, and the insulating film, to form a first gate insulating film including the insulating film with the first element diffused therein and a first gate electrode including the second electrode film on the first region, and form a second gate insulating film including the insulating film and a second gate electrode including the second electrode film and the first electrode film on the second region.

11. The fabrication method for a semiconductor device of claim 10, wherein in the step (a), a second cap film containing a second element is formed between the insulating film and the first electrode film, and
in the step (f), the second gate insulating film including the insulating film and the second cap film is formed.

12. The fabrication method for a semiconductor device of claim 11, wherein the second element is aluminum or tantalum.

13. The fabrication method for a semiconductor device of claim 10, further comprising the step of (i) removing the first electrode film between the step (d) and the step (e),
wherein in the step (a), a second cap film containing a second element is formed between the insulating film and the first electrode film, and
in the step (f), the second gate insulating film including the insulating film and the second cap film is formed.

* * * * *